(12) United States Patent
Hanson et al.

(10) Patent No.: US 7,892,942 B2
(45) Date of Patent: Feb. 22, 2011

(54) METHODS OF FORMING SEMICONDUCTOR CONSTRUCTIONS, AND METHODS OF FORMING ISOLATION REGIONS

(75) Inventors: Robert J. Hanson, Boise, ID (US); Janos Fucsko, Boise, ID (US)

(73) Assignee: Micron Technology Inc., Boise, ID (US)

( * ) Notice: Subject to any disclaimer, the term of this patent is extended or adjusted under 35 U.S.C. 154(b) by 220 days.

(21) Appl. No.: 11/774,709

(22) Filed: Jul. 9, 2007

(65) Prior Publication Data
US 2009/0017596 A1 Jan. 15, 2009

(51) Int. Cl.
*H01L 21/76* (2006.01)
(52) U.S. Cl. .................. 438/435; 257/E21.546
(58) Field of Classification Search ............ 438/778, 438/780, 781, 787, 788, 789, 790, 424, 430, 438/431, 210–211, 433, 435, 201, 257–267
See application file for complete search history.

(56) References Cited

U.S. PATENT DOCUMENTS

| | | | | |
|---|---|---|---|---|
| 6,417,073 B2 * | 7/2002 | Watanabe | ........ | 438/424 |
| 6,566,229 B2 * | 5/2003 | Hong et al. | ........ | 438/435 |
| 7,192,891 B2 * | 3/2007 | Goo et al. | ........ | 438/782 |
| 7,439,157 B2 * | 10/2008 | Bian et al. | ........ | 438/435 |
| 7,659,159 B2 * | 2/2010 | Lee | ........ | 438/210 |
| 2004/0198019 A1 * | 10/2004 | Yasui et al. | ........ | 438/435 |
| 2005/0287731 A1 * | 12/2005 | Bian et al. | ........ | 438/201 |
| 2006/0006451 A1 * | 1/2006 | Lindsay | ........ | 257/314 |
| 2006/0102977 A1 * | 5/2006 | Fucsko et al. | ........ | 257/499 |
| 2006/0151855 A1 * | 7/2006 | Kiyotoshi et al. | ........ | 257/618 |
| 2006/0160321 A1 * | 7/2006 | Ichiyama et al. | ........ | 438/424 |
| 2008/0064194 A1 * | 3/2008 | Hong | ........ | 438/589 |

OTHER PUBLICATIONS

CRC handbook on Chemistry and Physics 82 2nd edition.*

* cited by examiner

*Primary Examiner*—Matthew W Such
*Assistant Examiner*—Ali Naraghi
(74) *Attorney, Agent, or Firm*—Wells St. John PS

(57) ABSTRACT

Some embodiments include methods of forming isolation regions in which spin-on material (for example, polysilazane) is converted to a silicon dioxide-containing composition. The conversion may utilize one or more oxygen-containing species (such as ozone) and a temperature of less than or equal to 300° C. In some embodiments, the spin-on material is formed within an opening in a semiconductor material to form a trenched isolation region. Other dielectric materials may be formed within the opening in addition to the silicon dioxide-containing composition formed from the spin-on material. Such other dielectric materials may include silicon dioxide formed by chemical vapor deposition and/or silicon dioxide formed by high-density plasma chemical vapor deposition.

16 Claims, 7 Drawing Sheets

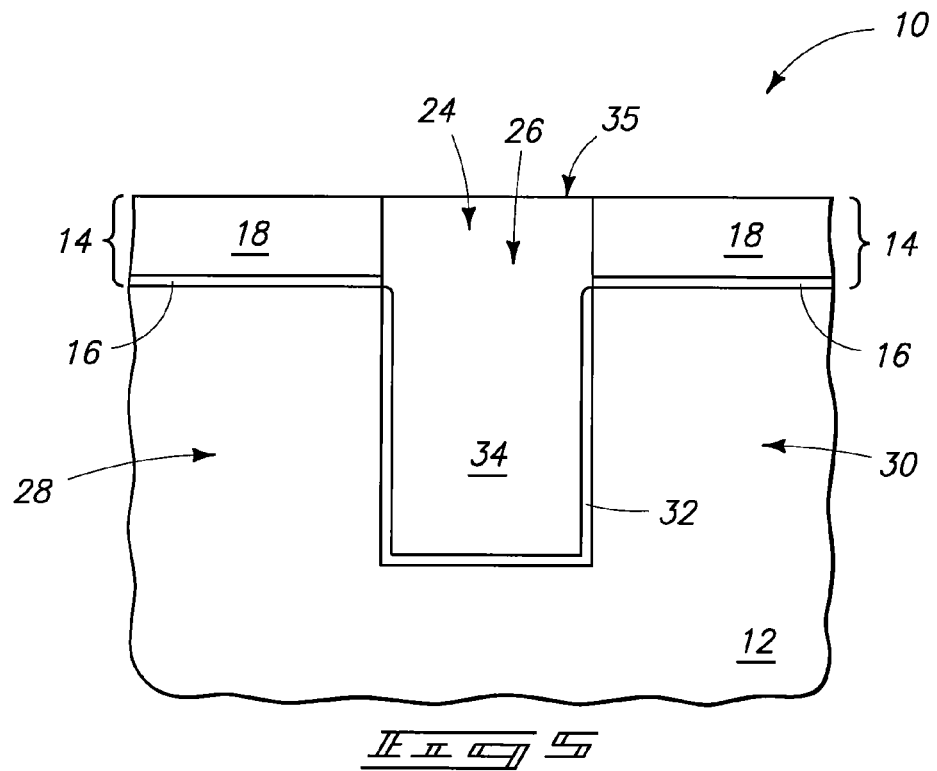
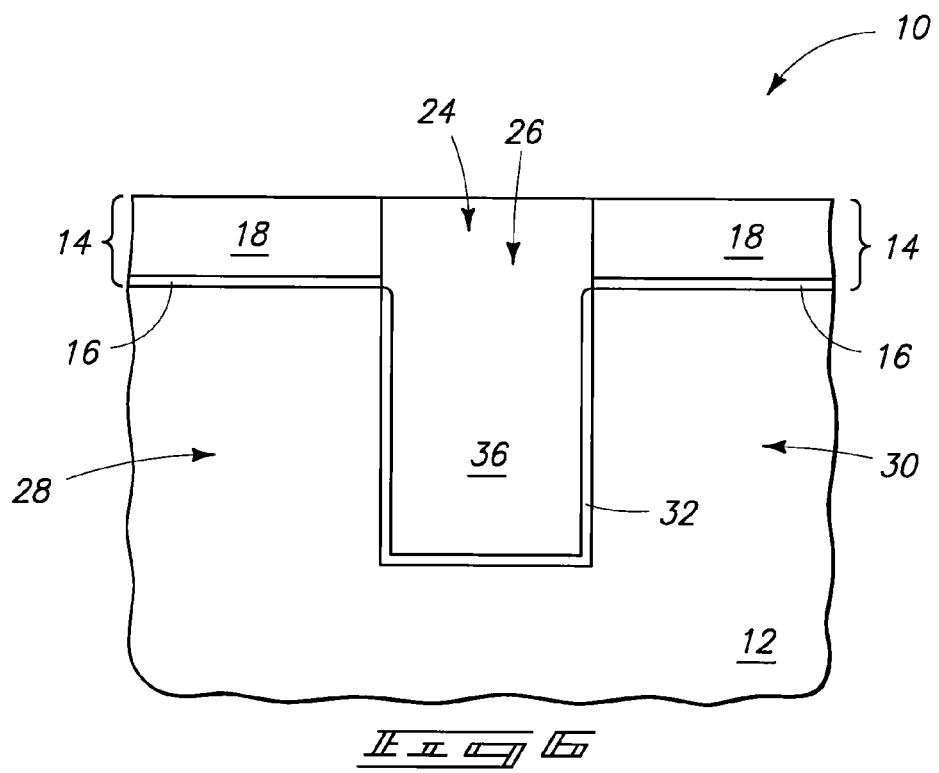

METHODS OF FORMING SEMICONDUCTOR CONSTRUCTIONS, AND METHODS OF FORMING ISOLATION REGIONS

TECHNICAL FIELD

Methods of forming oxides, methods of forming semiconductor constructions, and methods of forming isolation regions.

BACKGROUND

In modern semiconductor device applications, millions of individual devices may be packed onto a single small area of a semiconductor substrate. Many of these devices may need to be electrically isolated from one another. One method of accomplishing such isolation is to form a trench isolation region between adjacent devices.

Various insulative materials have been formed within trenches for trench isolation. For instance, thermally grown silicon dioxide may be formed to line the trenches, silicon nitride formed over the thermally-grown silicon dioxide, and a thick filler of silicon dioxide formed over the silicon nitride. The thick filler of silicon dioxide may be formed by chemical vapor deposition (CVD) or high-density plasma chemical vapor deposition (HDP-CVD). A high density plasma is a plasma having a density of greater than $10^{10}$ ions/cm$^3$.

The utilization of CVD and/or HDP-CVD to form oxide may lead to incomplete filling of at least some of the trenches, which may create non-uniformity of isolation across a semiconductor substrate.

Another method which may be utilized to form thick layers of oxide in addition to, or alternatively to, CVD or HDP-CVD is oxidation of a spin-on material. For instance, polysilazane film may be formed across a substrate by a spin-on process, and then converted to silicon dioxide. Polysilazane has a structural formula of $[SiNR_1R_2R_3]_n$, where $R_1$, $R_2$ and $R_3$ are all hydrogen in the case of inorganic polysilazane; and are alkyl, aryl or alkoxyl organic moieties in organic polysilazane. The conversion of polysilazane to silicon dioxide may be accomplished utilizing steam at a temperature of from about 600° C. to about 1050° C.

Unfortunately, the high temperature steam oxidation attacks silicon and may result in consumption of a large amount of transistor active area real estate. One method of alleviating this problem during fabrication of dynamic random access memory (DRAM) on a silicon substrate is to form a thin layer of thermally grown silicon dioxide, followed by a thin layer of silicon nitride. The thin silicon dioxide layer and thin silicon nitride layer together form a barrier to oxidation which protects against consumption of active area silicon.

The utilization of the silicon nitride causes additional process steps which reduce throughput. Further, utilization of silicon nitride is not practical during fabrication of some types of memory. For instance, silicon nitride films may be problematic during fabrication of NAND memory due to problems of leakage and charge trapping that may occur if the silicon nitride is too near to tunnel dielectric of the memory cells utilized in the NAND memory.

High-temperature steam oxidation may further create complications during fabrication of integrated circuitry in that some devices may not tolerate the high temperature utilized for the oxidation.

It would be desirable to develop new methods of forming trench isolation which avoid one or more of the above-discussed problems.

BRIEF DESCRIPTION OF THE DRAWINGS

FIG. 5 is a view of the cross-section of FIG. 1 shown at a processing stage subsequent to that of FIG. 4.

FIG. 6 is a view of the cross-section of FIG. 1 shown at a processing stage subsequent to that of FIG. 5.

DETAILED DESCRIPTION OF THE ILLUSTRATED EMBODIMENTS

In some embodiments, spin-on glass precursors (for instance, polysilazane) are subjected to oxidation under low temperature conditions (specifically, a temperature of less than or equal to 300° C.) to form silicon dioxide-containing compositions. The utilization of low temperature conditions may avoid one or more of the above-discussed problems associated with conventional processing. In some embodiments, the spin-on glass precursors are subjected to wet etching to modify the thickness of the precursors prior to the oxidation of such precursors.

Example embodiments are described with reference to FIGS. 1-13.

Figure 1:
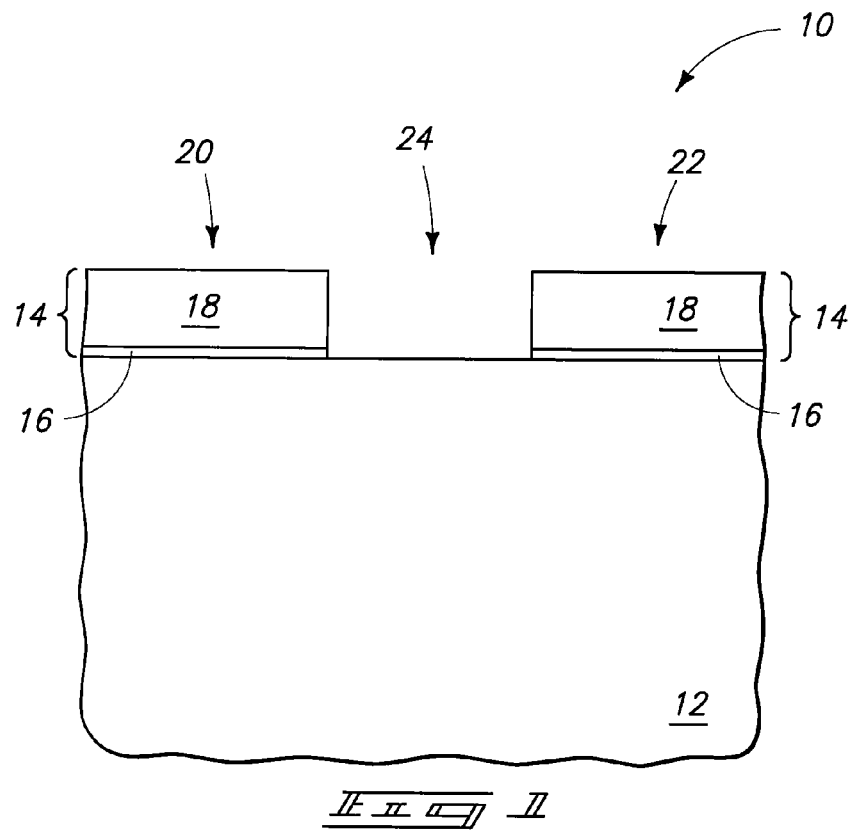
FIG. 1 is a cross-sectional view of a portion of a semiconductor wafer at a processing stage of an embodiment.

Referring to FIG. 1, a portion of a semiconductor construction 10 is illustrated. The semiconductor construction comprises a base 12. The base may comprise, consist essentially of, or consist of semiconductor material. For instance, the base may comprise, consist essentially of, or consist of monocrystalline silicon lightly background doped with p-type dopant. The base may be referred to as a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Although base 12 is shown to be homogenous, the base may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc.

A patterned mask 14 is over base 12. In the shown embodiment, the patterned mask comprises a first material 16 and a second material 18 over the first material. In some embodiments, the first material 16 may comprise, consist essentially of, or consist of silicon dioxide; and the second material 18 may comprise, consist essentially of, or consist of silicon nitride. The first material may be considered a pad oxide that protects an upper surface of base 12 from stress that may otherwise occur if the silicon nitride-containing material 18 directly contacted such upper surface. In some embodiments, the first material 16 may comprise tunnel dielectric, and material 18 may comprise charge storage material suitable for incorporation into a nonvolatile memory cell. The tunnel dielectric may, for example, comprise silicon dioxide and/or high-k dielectric material (with the term "high-k dielectric material" referring to dielectric material having a dielectric constant greater than that of silicon dioxide). The charge storage material may, for example, comprise polycrystalline silicon (floating gate material) and/or charge trapping material.

The patterned mask comprises a pair of segments 20 and 22, and defines a gap 24 between such segments. The gap may be considered to correspond to a location of an opening (or trench) which ultimately is utilized to form an isolation region.

The mask 14 may be formed by, for example, forming a photolithographically patterned photoresist mask (not shown) over material 18, transferring a pattern from the photoresist mask to material 18 and 16, and then removing the photoresist mask to leave the construction of FIG. 1.

Figure 2:
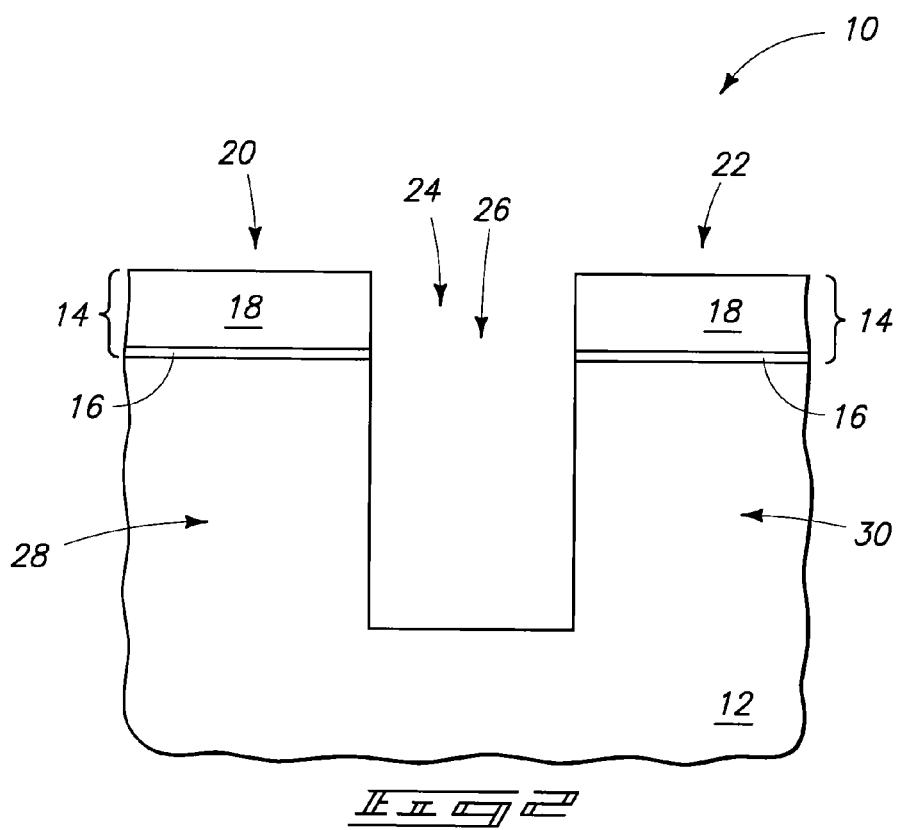
FIG. 2 is a view of the cross-section of FIG. 1 shown at a processing stage subsequent to that of FIG. 1.

Referring to FIG. 2, gap 24 is extended into semiconductor material 12 to form an opening 26 within the semiconductor material. The opening may be formed with an etch selective for material of substrate 12 relative to materials 16 and 18. An etch is considered selective for a first material relative to a second material if the etch removes the first material at a faster rate than it removes the second material, which may include but is not limited to, an etch which is 100 percent selective for the first material relative to the second material. The formation of the opening may be considered removal of semiconductor material from the opening location defined by mask 14.

The patterning of FIG. 2 may be considered to pattern the base 12 into a pair of semiconductor material mesas 28 and 30 which are separated from one another by opening 26.

Figure 3:
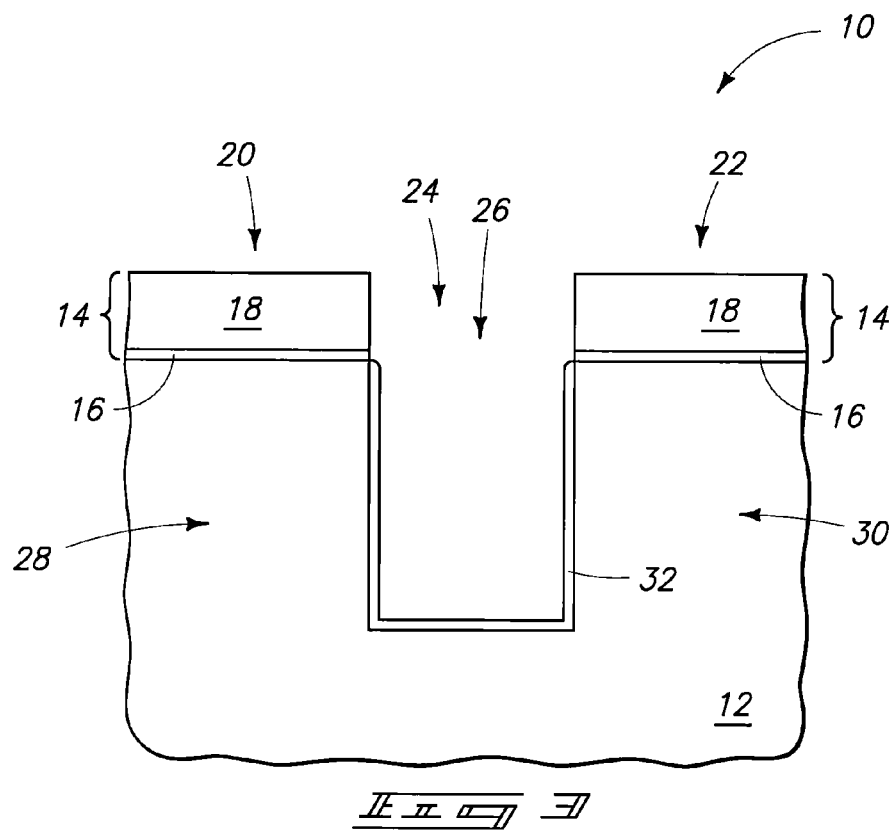
FIG. 3 is a view of the cross-section of FIG. 1 shown at a processing stage subsequent to that of FIG. 2.

Referring to FIG. 3, a layer of oxide 32 is a thermally grown from exposed surfaces of semiconductor material 12 within the opening 26. In embodiments in which semiconductor material 12 comprises silicon, the oxide 32 may comprise, consist essentially of, or consist of silicon dioxide. The oxide 32 lines the sidewalls and bottom of opening 26, and thus narrows opening 26. In some embodiments, at least a portion of oxide 32 may be deposited instead of being thermally grown.

Figure 4:
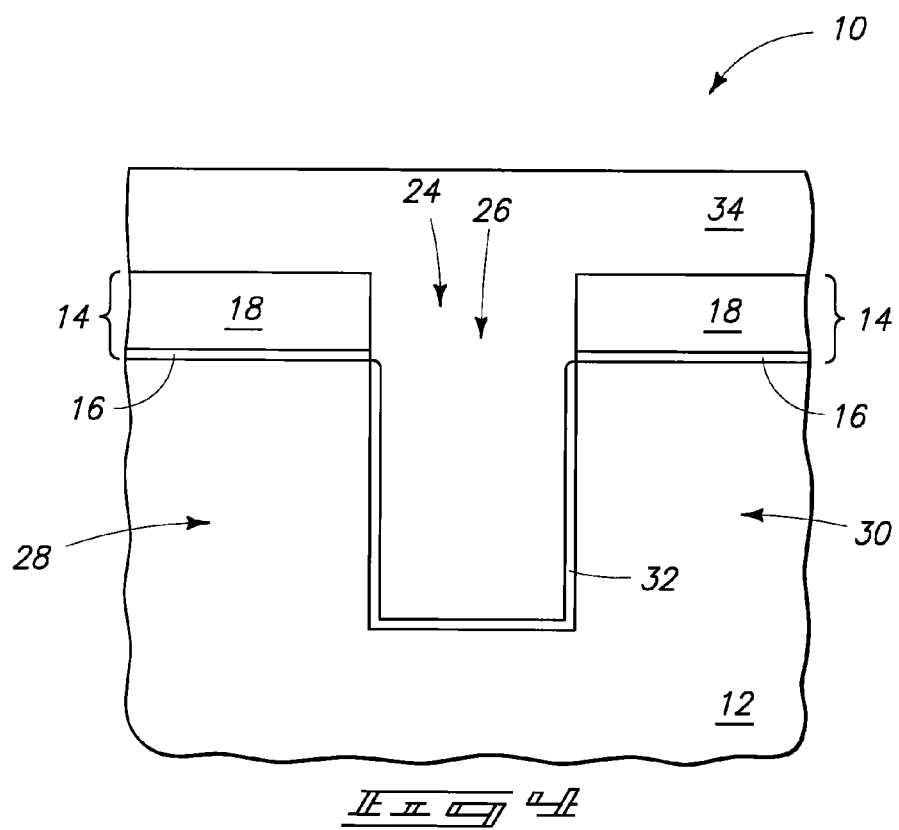
FIG. 4 is a view of the cross-section of FIG. 1 shown at a processing stage subsequent to that of FIG. 3.

Referring to FIG. 4, a material 34 is formed over base 12 and within opening 26. The material may be formed with a spin-on process and may, for example, comprise, consist essentially of, or consist of polysilazane. The term "spin-on process" refers to a process in which a fluid is dispensed onto a substrate and the substrate is spun to disperse the fluid across at least a portion of the substrate and thereby coat at least a portion of the substrate. In the shown embodiment, the material 34 extends over masking materials 16 and 18.

In some embodiments, the polysilazane may be comprised primarily of a polymeric matrix of Si, N and H, and may be dispersed with a carrier solvent such as, for example, di-butyl ether.

Referring to FIG. 5, material 34 is subjected to planarization, such as, for example, chemical-mechanical polishing (CMP) to remove the material 34 from over masking material 18. The planarization forms a planarized upper surface 35 extending across materials 18 and 34.

Referring to FIG. 6, material 34 (FIG. 5) is converted to an oxide-containing material 36. The oxide-containing material may comprise, consist essentially of, or consist of silicon dioxide. The conversion of the spun-on material to oxide-containing material may be conducted at low temperature (specifically, a temperature less than or equal to 300° C.) utilizing a partial pressure of ozone.

In some embodiments, material 34 consists of polysilazane and is converted to a silicon dioxide-containing composition by exposing material 34 to one or more oxygen-containing species while keeping a temperature of material 34 at less than or equal to 300° C. The temperature may be, for example, from about 20° C. to about 300° C., or from about 70° C. to about 300° C. In some processes, the temperature may be about 105° C.

The conversion of material 34 to the silicon dioxide-containing composition may be conducted in a reaction chamber, and ozone may be flowed into the reaction chamber as a source of at least some of the oxygen-containing species utilized for such conversion. In some embodiments, the ozone is the source of all, or at least substantially all, of the oxygen-containing species. In some embodiments, at least 50 percent (by volume) of the oxygen-containing species originate from ozone. The species originating from ozone may be ozone itself, or may be activated species (for instance, radicals, ions, etc.) derived from ozone.

A partial pressure of ozone within the chamber may be from about 1 KPa to about 200 KPa, and a total pressure within the chamber may be from about 1 KPa to about 1 megapascal (MPa). In some embodiments, the ozone may be flowed into the chamber to a concentration of about 200 gram/meter$^3$.

The polysilazane may be converted to stoichiometric SiO$_2$, or at least to near stoichiometric SiO$_2$, with the term "near stoichiometric" meaning that the ratio of oxygen to silicon is within about 10% of being 2:1. For instance, a 3500 Å thick layer of polysilazane may comprise from about 55 to about 58 atomic percent silicon, from about 28 to about 34 atomic percent nitrogen, and from about 0.5 to about 18 atomic percent oxygen. The oxidation described herein may convert the polysilazane to an oxide comprising from about 60 to about 65 atomic percent oxygen, from about 34 to about 36 atomic percent of silicon, and from about zero to about one atomic percent nitrogen.

The silicon dioxide-containing material 36 may be treated with a densification process utilizing a temperature of at least about 300° C. and either an N$_2$ or O$_2$ ambient to increase the density of the material 36 in some embodiments.

Figure 7:
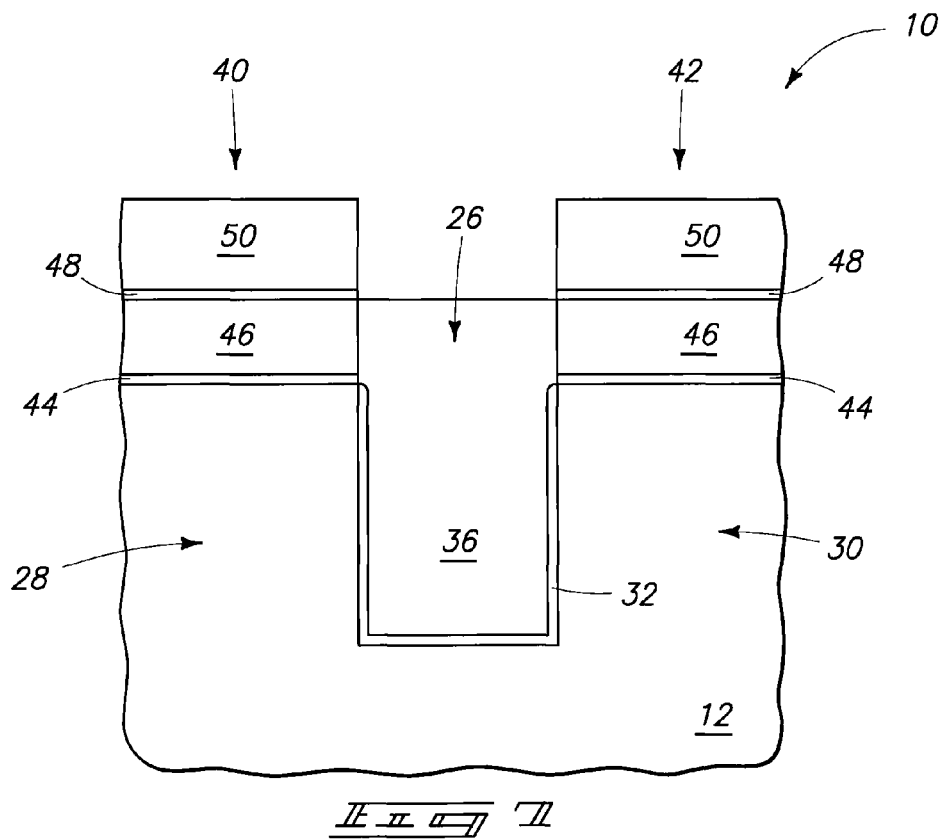
FIG. 7 is a view of the cross-section of FIG. 1 shown at a processing stage subsequent to that of FIG. 6.

Referring to FIG. 7, a pair of nonvolatile memory cells 40 and 42 are formed over mesas 28 and 30, respectively. The nonvolatile memory cells comprise gate stacks which contain tunnel dielectric 44, charge storage material 46, intergate dielectric material 48 and control gate material 50. The tunnel dielectric may, for example, comprise silicon dioxide and/or high-k dielectric material; the charge storage material may, for example, comprise conductively-doped silicon or charge trapping material (for instance, silicon nitride, nanodots, etc.); the intergate dielectric material may, for example, comprise silicon dioxide and/or high-k dielectric material; and the control gate material may comprise metal (for instance, tungsten, titanium, etc.), metal-containing compositions (for instance, metal nitride, metal silicides, etc.), and/or conductively-doped semiconductor material (for instance, conductively-doped silicon, etc.).

The nonvolatile memory cells may also comprise conductively-doped source/drain regions (not shown) within base 12 adjacent the shown gate stacks. The source/drain regions may be formed into and out of the page relative to the shown cross-sectional view.

The silicon dioxide-containing composition 36 within opening 26 forms an isolation region that electrically isolates memory cell 40 from memory cell 42. In other embodiments, other types of devices may be isolated from one another by the isolation. For instance, DRAM memory cells may be isolated from one another by isolation formed from spun-on material treated with oxygen-containing species and low temperature.

The nonvolatile memory cells of FIG. 7 may be replaced by field effect transistors in some embodiments.

In embodiments in which masking material 14 (FIGS. 1-6) comprises silicon nitride or silicon dioxide, the masking material may be removed and replaced with the various materials of the nonvolatile memory cells. In embodiments in which masking material 14 comprises charge storage material (for instance, polysilicon) over tunnel dielectric, the masking material may remain at the processing stage of FIG. 7 so that dielectric 44 of FIG. 7 corresponds to the dielectric 16 of FIG. 6, and charge storage material 46 of FIG. 7 corresponds to the material 18 of FIG. 6.

FIG. 7 shows the silicon dioxide-containing composition 36 extending to an elevational level above an uppermost surface of tunnel dielectric 44. Accordingly, the silicon dioxide-containing composition 36 is adjacent the tunnel dielectric 44. It may be desired that the silicon dioxide adjacent the tunnel dielectric be of high-quality relative to composition and density. Specifically, some forms of silicon dioxide are more homogeneous in composition than others. If the oxidation of the spin-on material does not fully oxidize such material, the resulting silicon dioxide-containing composition may have nitrogen, hydrogen or other contaminants within it, which may degrade the electrical properties of such silicon dioxide-containing composition. Also, some forms of silicon dioxide are denser than others, with the density being determined by a rate at which the silicon dioxide is etched. High density forms of silicon dioxide will etch slower than low-density forms of silicon dioxide under some wet etch conditions. The etch rate may be determined with dilute HF (for example, 300:1 water:hydrofluoric acid) as described in U.S. Pat. No. 7,041,547, which lists Shubneesh Batra and Gurtej Sandhu as inventors.

It may be desired that the silicon dioxide adjacent the tunnel dielectric be of high density (specifically, a density comparable to that of silicon dioxide formed by HDP-CVD or thermal processing), and of high purity (specifically, a purity comparable to that of silicon dioxide formed by HDP-CVD or thermal processing). The oxide 36 may be of acceptable purity and density. If it is not, various methods may be used to form the oxide 36 within a lower region of opening 26, and to then provide other forms of oxide over the oxide 36 to fill a remaining portion of the opening. Example embodiments are discussed with reference to FIGS. 8-13.

Figure 8:
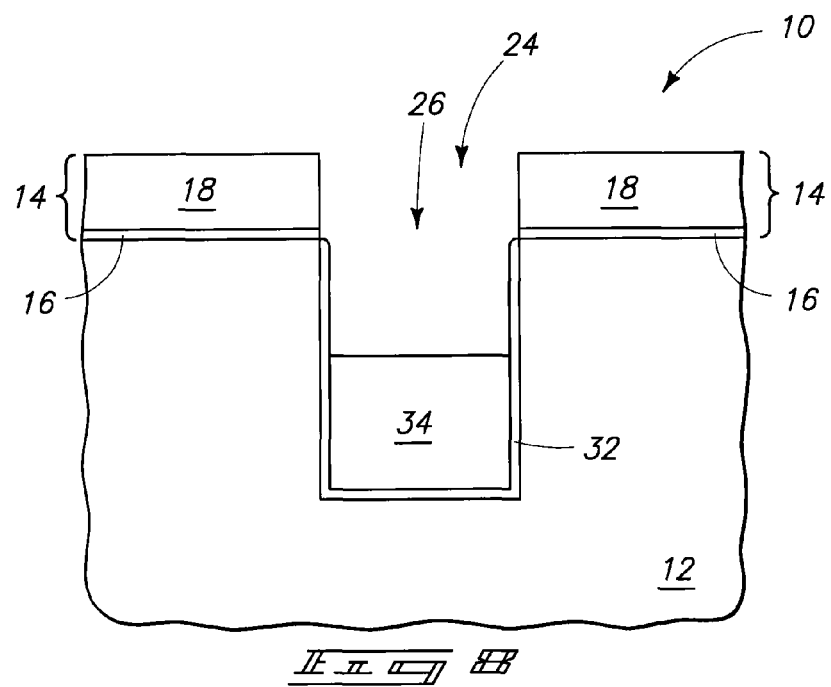
FIG. 8 is a view of the cross-section of FIG. 1 shown at a processing stage subsequent to that of FIG. 4 in accordance with another embodiment.

Referring to FIG. 8, semiconductor construction 10 is shown at a processing stage subsequent to that of FIG. 4. An etch has been utilized to remove some of the spun-on material 34. The etch reduces a thickness of material 34 within opening 26 so that the material now only partially fills the opening. If material 34 comprises, consists essentially of, or consists of polysilazane, the etch may be a wet etch utilizing halogenic acid (for instance, hydrochloric acid and/or hydrofluoric acid) or a base (for instance, ammonium hydroxide, trimethylammonium hydroxide, sodium hydroxide, potassium hydroxide, and/or cesium hydroxide). The wet etch may utilize a dip of construction 10 into a liquid comprising the acid or base. An example etch may utilize ammonium hydroxide, with a concentration of the ammonium hydroxide being from about 0.2 percent to about 30 percent (by volume) in water. The concentration of ammonium hydroxide may be, for example, about 0.25 percent (by volume) in water. The ammonium hydroxide solution may be at a temperature of from about 10° C. to about 100° C. during the etch, and may, for example, be at a temperature of about 65° C. during the etch.

The wet etch has reduced an uppermost level of spun-on material 34 to beneath the bottom surface of material 16. The bottom surface of material 16 is about the level of tunnel dielectric 44 (FIG. 7), and accordingly the wet etch has reduced an uppermost level of material 34 to beneath a level of the bottom surface of tunnel dielectric that will ultimately be formed adjacent opening 26.

Figure 9:
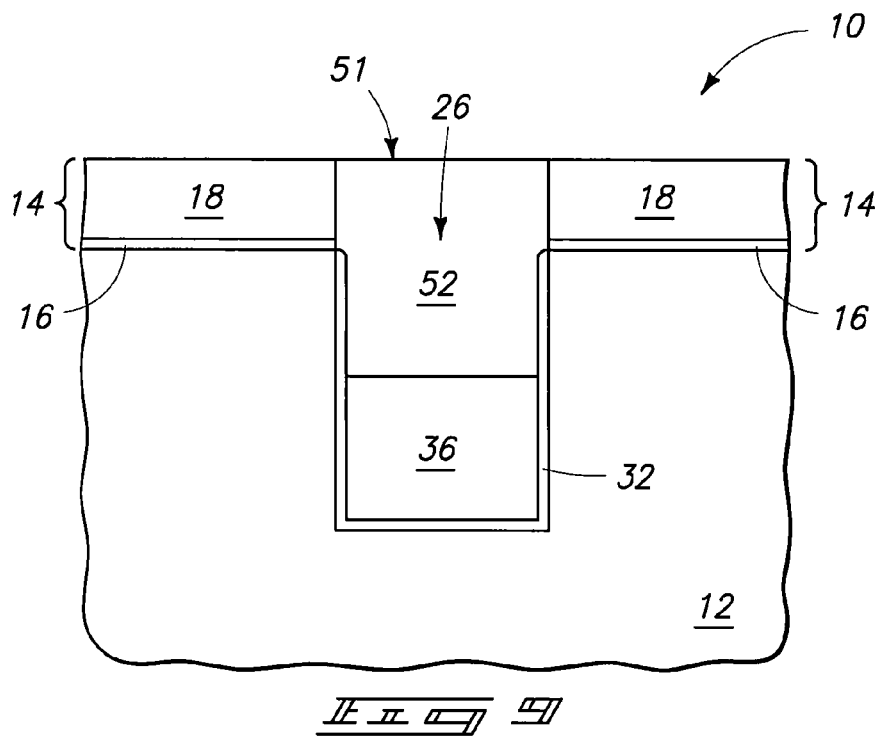
FIG. 9 is a view of the cross-section of FIG. 8 shown at a processing stage subsequent to that of FIG. 8.

Referring to FIG. 9, the spun-on material 34 (FIG. 8) is converted to silicon dioxide-containing material 36, and subsequently another dielectric material 52 is formed over material 36 to fill opening 26. The material 52 has a planarized upper surface 51 which may be formed by CMP of material 52.

Material 34 may be converted to the silicon dioxide-containing material 36 utilizing the low temperature oxidation discussed above, and the material 36 may be subjected to the densification process discussed above.

Dielectric material 52 may comprise, consist essentially of, or consist of silicon dioxide. Such silicon dioxide may be formed by CVD (for instance, utilizing tetraethylorthosilicate (TEOS) as a precursor), or by HDP-CVD. Dielectric material 52 may be high quality silicon dioxide.

The construction 10 may be treated with dilute hydrofluoric acid after oxidation of material 34 and prior to formation of dielectric 52 to remove contamination and flatten exposed surfaces of construction 10. Also, silicon dioxide-containing material 36 may be treated with a plasma-based oxidation utilizing $O_2$ feed gas, a downstream microwave reactor, a temperature of from about 100° C. to about 300° C., and a power of from about 1000 watts to about 5000 watts. Such treatment may remove any liquid remaining within material 36, and further assist in converting the silicon dioxide-containing material to high purity, high density silicon dioxide.

The dielectric material 52 may be formed in a single deposition, or may be formed utilizing multiple depositions. For instance, a lower portion of material 52 may be formed by HDP-CVD of silicon dioxide, than there may be an etchback to flatten a surface of such lower portion, followed by another deposition of HDP-CVD silicon dioxide.

Figure 10:
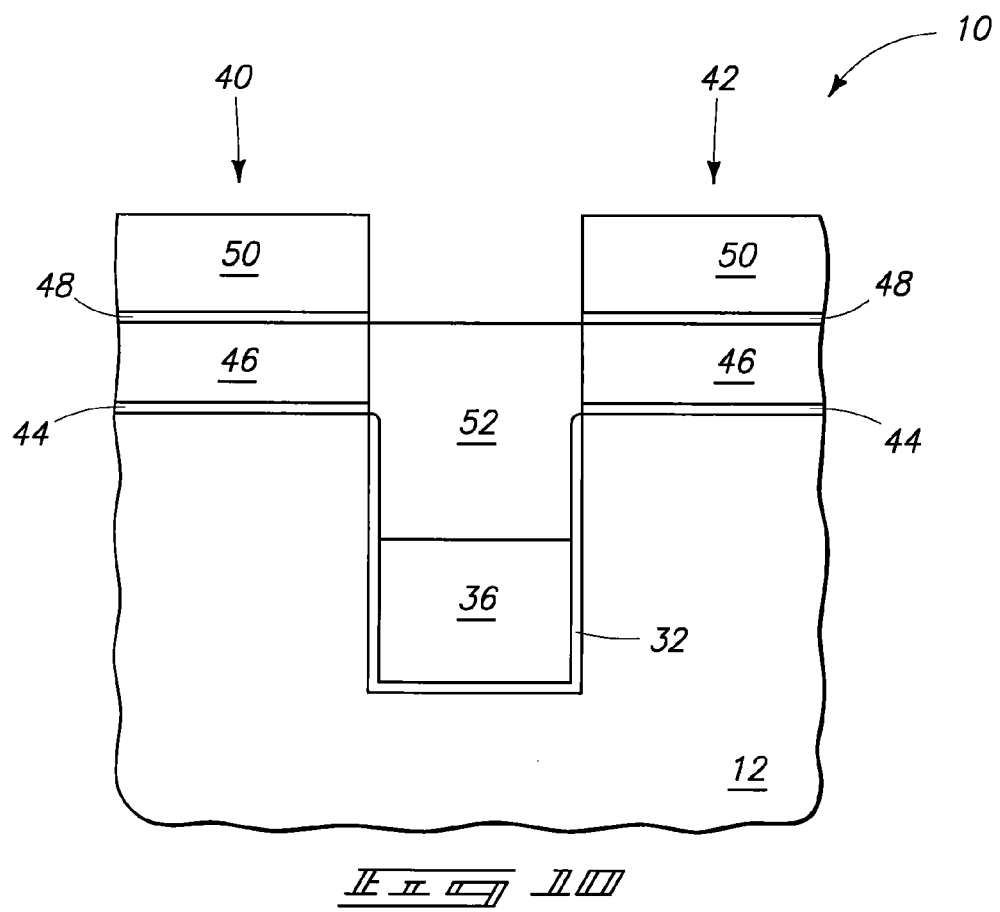
FIG. 10 is a view of the cross-section of FIG. 8 shown at a processing stage subsequent to that of FIG. 9.

Referring to FIG. 10, construction 10 is shown after the structure of FIG. 9 has been subjected to additional processing similar to that described above with reference to FIG. 7. Such processing has formed electrical devices 40 and 42 on opposing sides of the trenched isolation region comprising dielectric materials 32, 36 and 52. Such electrical devices comprise tunnel dielectric 44. The tunnel dielectric has a lowermost surface above the uppermost surface of silicon oxide-containing material 36, and adjacent the oxide 52.

Another embodiment is described with reference to FIGS. 11-13.

Figure 11:
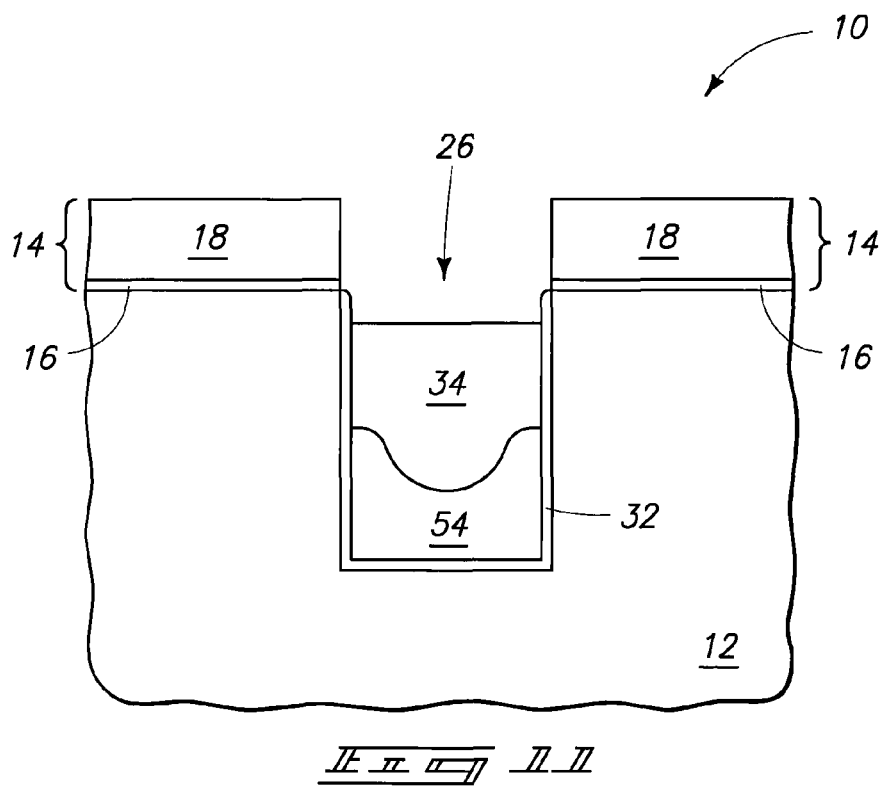
FIG. 11 is a view of the cross-section of FIG. 1 shown at a processing stage subsequent to that of FIG. 2 in accordance with another embodiment.

FIG. 11 shows construction 10 at a processing stage subsequent to that of FIG. 2. The construction comprises opening 26, and the liner 32 within the opening. However, in contrast to the embodiment of FIG. 3, the embodiment of FIG. 11 comprises a dielectric material 54 partially filling opening 26, and then comprises spun-on dielectric material 34 over the dielectric material 54.

The dielectric material 54 may comprise a high density silicon dioxide, such as a silicon dioxide formed by HDP-CVD. The dielectric material 54 may, for example, fill up to about the bottom third of the lined opening. In some embodiments, the dielectric material 54 may extend to above tunnel dielectric 16.

Material 34 is shown partially filling opening 26. Material 34 may have been formed to completely fill the opening, and then subjected to a wet etch to reduce an upper level of material 34 to beneath the level of the bottom surface of dielectric 16.

Figure 12:
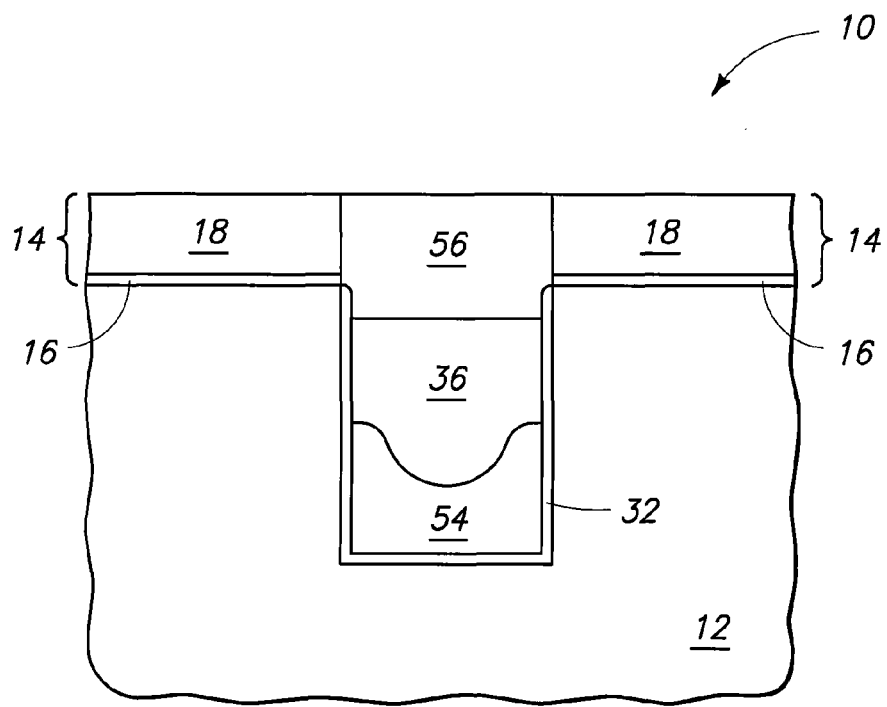
FIG. 12 is a view of the cross-section of FIG. 11 shown at a processing stage subsequent to that of FIG. 11.

Referring to FIG. 12, spun-on material 34 is converted to silicon dioxide-containing material 36, and high-density silicon dioxide 56 is formed over the silicon dioxide-containing material 36. The material 56 may be formed by the processing discussed above for formation of dielectric material 52 of FIG. 9.

Figure 13:
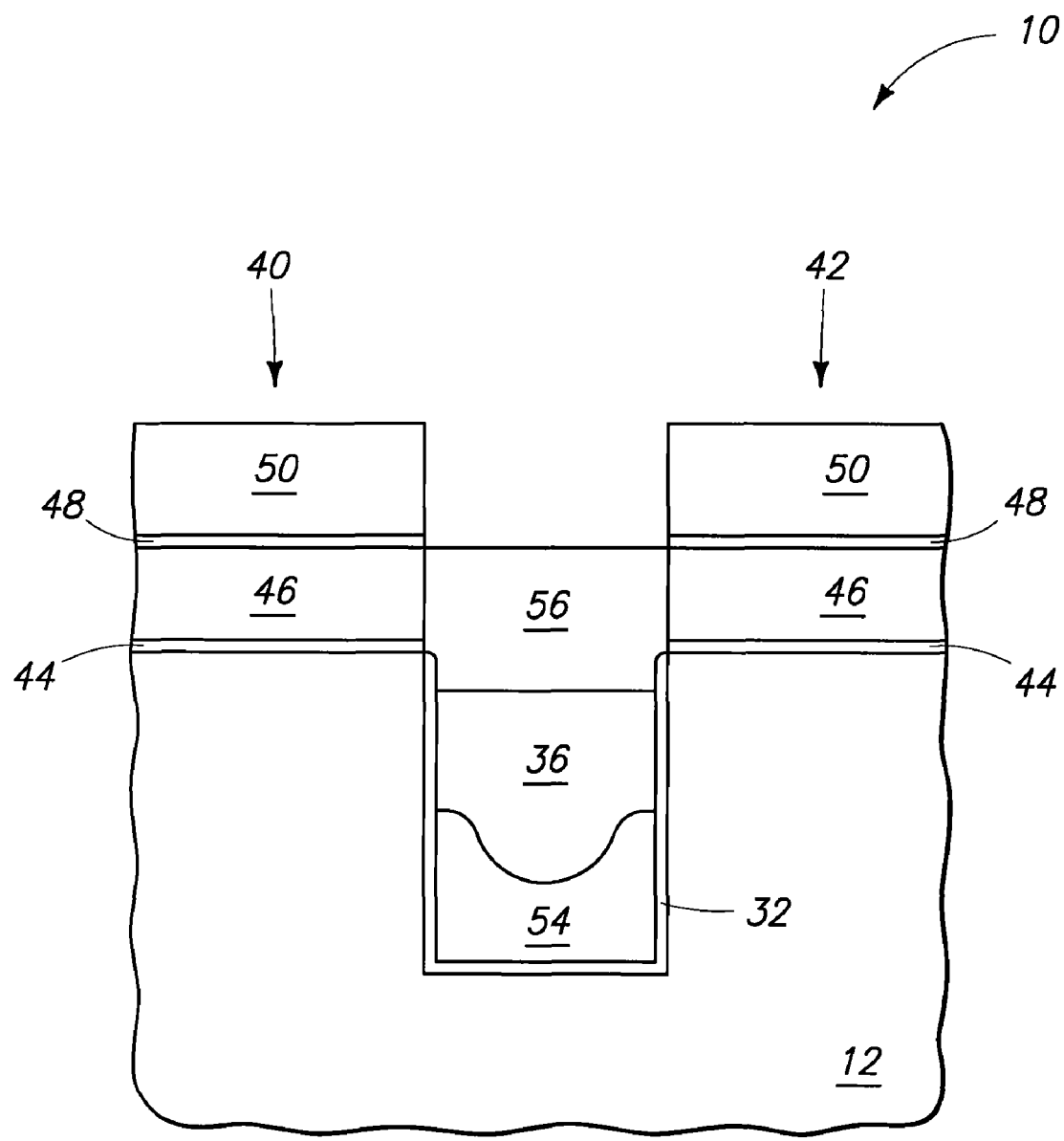
FIG. 13 is a view of the cross-section of FIG. 11 shown at a processing stage subsequent to that of FIG. 12.

Referring to FIG. 13, construction 10 is shown after the structure of FIG. 12 has been subjected to additional processing similar to that described above with reference to FIG. 7. Such processing has formed electrical devices 40 and 42 on opposing sides of the trenched isolation region comprising dielectric materials 32, 36, 54 and 56. Such electrical devices comprise tunnel dielectric 44. The tunnel dielectric has a lowermost surface above the uppermost surface of silicon oxide-containing material 36, and adjacent the high-density oxide 56.

Although the low temperature treatment of polysilazane is described above for forming silicon dioxide of isolation regions, in other embodiments the silicon dioxide may be used in other applications in addition to, or alternatively to, the utilization in isolation regions. For instance, the silicon dioxide may be used as dielectric material of capacitors, as intergate dielectric material, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a semiconductor construction, comprising:
    forming a patterned mask over a semiconductor material; the patterned mask comprising tunnel dielectric, and comprising polysilicon over the tunnel dielectric;
    while using the patterned mask to define a location of an opening, removing semiconductor material from said location to form the opening;
    forming a silicon dioxide liner within the opening and directly against the semiconductor material;
    forming polysilazane along the liner within the opening to a level that only partially fills the opening and leaves a remainder of the opening unfilled, the polysilazane being directly against the silicon dioxide liner;
    converting the polysilazane to a silicon dioxide-containing composition; said converting using a temperature of less than 300° C., and using gaseous ozone;
    forming high density silicon dioxide over the silicon dioxide-containing composition to fill the remainder of the lined opening; and
    forming a pair of memory cells on opposing sides of the opening, the memory cells comprising the tunnel dielectric and the polysilicon; the memory cells further comprising intergate dielectric material over the polysilicon, and control gate material over the intergate dielectric material; the tunnel dielectric being laterally adjacent the high density silicon dioxide, and being elevationally above the silicon dioxide-containing composition; an entirety of the intergate dielectric material being elevationally above all of the high density silicon dioxide that is between the pair of the memory cells.

2. The method of claim 1 wherein the converting occurs in a reaction chamber, and wherein a partial pressure of ozone within the reaction chamber during the converting is from about 1 kPa to about 200 kPa.

3. The method of claim 2 wherein a total gas pressure within the reaction chamber during the converting is from about 100 kPa to about 1 MPa.

4. The method of claim 1 further comprising performing an etchback of the high density silicon dioxide within the opening to flatten an upper surface of the high density silicon dioxide, and then chemical vapor depositing silicon dioxide over the flattened upper surface; and wherein an entirety of the intergate dielectric material is elevationally above all of the chemical vapor-deposited silicon dioxide within the opening.

5. The method of claim 1 wherein the tunnel dielectric comprises high-k dielectric material.

6. The method of claim 1 wherein the tunnel dielectric comprises high-k dielectric material and silicon dioxide material.

7. The method of claim 1 wherein the forming of the silicon dioxide liner comprises forming a first portion of the silicon dioxide liner by a first processing method and forming a second portion of the silicon dioxide liner by a second processing method different from the first processing method.

8. The method of claim 7 wherein the first processing method comprises thermally growing and wherein the second processing method comprises depositing.

9. The method of claim 1 wherein the forming of the high density silicon dioxide comprises utilizing multiple depositions steps.

10. A method of forming an isolation region, comprising:
    forming a patterned mask over a semiconductor material of a semiconductor substrate; the patterned mask comprising tunnel dielectric, and comprising polysilicon over the tunnel dielectric;
    while using the patterned mask to define a location of a trench, removing semiconductor material of the substrate from said location to form the trench;
    lining the trench with a silicon dioxide liner;
    utilizing high density plasma chemical vapor deposition to form first silicon dioxide within the lined trench, the first silicon dioxide being directly against the silicon dioxide liner;
    forming polysilazane within the lined trench and over the first silicon dioxide; the polysilazane being directly against the silicon dioxide liner;
    reducing a height of the polysilazane within the trench with a wet etch;

converting the polysilazane to a silicon dioxide-containing composition by exposing the polysilazane to gas phase ozone while keeping a temperature of the polysilazane less than or equal to 300° C.;

utilizing high density plasma chemical vapor deposition to form second silicon dioxide within the trench over the silicon dioxide-containing composition;

forming a pair of memory cells on opposing sides of the trench, the memory cells comprising the tunnel dielectric and the polysilicon; the memory cells further comprising intergate dielectric material over the polysilicon, and control gate material over the intergate dielectric material; and wherein the silicon dioxide-containing composition is entirely below a level of the tunnel dielectric of the nonvolatile memory cells and an entirety of the intergate dielectric material is elevationally above all of the second silicon dioxide.

11. The method of claim 10 further comprising performing an etchback of the second silicon dioxide within the opening to flatten an upper surface of the second silicon dioxide, and then chemical vapor depositing third silicon dioxide over the flattened upper surface; and wherein the intergate dielectric material is elevationally above the third silicon dioxide.

12. The method of claim 10 wherein the tunnel dielectric comprises high-k dielectric material.

13. The method of claim 10 wherein the tunnel dielectric comprises high-k dielectric material and silicon dioxide material.

14. The method of claim 10 wherein the forming of the silicon dioxide liner comprises forming a first portion of the silicon dioxide liner by a first processing method and forming a second portion of the silicon dioxide liner by a second processing method different from the first processing method.

15. The method of claim 14 wherein the first processing method comprises thermally growing and wherein the second processing method comprises depositing.

16. The method of claim 10 wherein the forming of the second silicon dioxide comprises utilizing multiple depositions steps.

* * * * *